(12) United States Patent
Chua et al.

(10) Patent No.: US 7,358,543 B2
(45) Date of Patent: Apr. 15, 2008

(54) LIGHT EMITTING DEVICE HAVING A LAYER OF PHOTONIC CRYSTALS AND A REGION OF DIFFUSING MATERIAL AND METHOD FOR FABRICATING THE DEVICE

(75) Inventors: Janet Bee Yin Chua, Perak (MY); Yue Hoong Lau, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 76 days.

(21) Appl. No.: 11/140,167

(22) Filed: May 27, 2005

(65) Prior Publication Data

US 2006/0270081 A1 Nov. 30, 2006

(51) Int. Cl.
*H01L 29/22* (2006.01)
*H01L 21/00* (2006.01)

(52) U.S. Cl. .............................. 257/98; 257/81; 438/29; 438/27

(58) Field of Classification Search ................ 438/29, 438/69, 71, 72, 27, 65; 257/79, 98, 99, 100, 257/81
See application file for complete search history.

(56) References Cited

U.S. PATENT DOCUMENTS

| 6,999,669 | B2 | 2/2006 | Summers et al. | |
|---|---|---|---|---|
| 2004/0150991 | A1* | 8/2004 | Ouderkirk et al. | 362/231 |
| 2004/0170352 | A1 | 9/2004 | Summers et al. | |
| 2004/0173806 | A1 | 9/2004 | Chua | |
| 2005/0093430 | A1* | 5/2005 | Ibbetson et al. | 313/501 |
| 2006/0066210 | A1* | 3/2006 | Ng et al. | 313/486 |
| 2006/0078734 | A1 | 4/2006 | Braune et al. | |
| 2006/0094137 | A1* | 5/2006 | Yan | 438/21 |
| 2006/0124947 | A1* | 6/2006 | Mueller et al. | 257/98 |
| 2006/0192225 | A1* | 8/2006 | Chua et al. | 257/100 |

FOREIGN PATENT DOCUMENTS

WO WO03/087441 A1 10/2003
WO WO2006/011095 A1 2/2006

OTHER PUBLICATIONS

Eli Yablonovitch, "Inhibited Spontaneous Emission in Solid-State Physics and Electronics", Physical Review Letters, May 18, 1987, vol. 58, No. 20, pp. 2059-2062.
S.Y. Lin, J.G. Fleming, D.L. Hetherington, B.K. Smith, R. Biswas, K.M. Ho, M.M. Sigalas, W. Zubrzycki, S.R. Kurtz & Jim Bur, "A Three-Dimensional Photonic Crystal Operating at Infrared Wavelengths", Letters to Nature, Jul. 16, 1998, vol. 394, pp. 251-253.
Susumu Noda, Katsuhiro Tomoda, Noritsugu Yamamoto, Alongkarn Chutinan, "Full Three-Dimensional Photonic Bandgap Crystals at Near-Infrared Wavelengths", Science, Jul. 28, 2000, vol. 289, pp. 604-606.
Younan Xia, Byron Gates, and Zhi-Yuan Li, "Self-Assembly Approaches to Three-Dimensional Photonic Crystals", Advanced Materials, Mar. 16, 2001, 13, No. 6, pp. 409-413.

* cited by examiner

*Primary Examiner*—Kevin M Picardat

(57) ABSTRACT

A light emitting device and method for fabricating the device utilizes a layer of photonic crystals and a region of diffusing material to enhance the light output of the device. The layer of photonic crystals is positioned over a light source, such as a light emitting diode die, and the region of diffusing material is positioned over the layer of photonic layer.

20 Claims, 7 Drawing Sheets

LIGHT EMITTING DEVICE HAVING A LAYER OF PHOTONIC CRYSTALS AND A REGION OF DIFFUSING MATERIAL AND METHOD FOR FABRICATING THE DEVICE

BACKGROUND OF THE INVENTION

Existing light emitting diodes ("LEDs") can emit light in the ultraviolet ("UV"), visible or infrared ("IR") wavelength range. These LEDs generally have narrow emission spectrum (approximately +/−10 nm). As an example, a blue InGaN LED may generate light with wavelength of 470 nm+/−10 nm. As another example, a green InGaN LED may generate light with wavelength of 510 nm+/−10 nm. As another example, a red AlInGaP LED may generate light with wavelength of 630 nm +/−10 nm.

However, in some applications, it is desirable to use LEDs that can generate broader emission spectrums to produce desired color light, such as white light. Due to the narrow-band emission characteristics, these monochromatic LEDs cannot be directly used to produce broad-spectrum color light. Rather, the output light of a monochromatic LED must be mixed with other light of one or more different wavelengths to produce broad-spectrum color light. This can be achieved by introducing one or more fluorescent materials into the encapsulant of a monochromatic LED to convert some of the original light into longer wavelength light through fluorescence. Such LEDs will be referred to herein as fluorescent LEDs. The combination of original light and converted light produces broad-spectrum color light, which can be emitted from the fluorescent LED as output light. The most common fluorescent materials used to create fluorescent LEDs that produce broad-spectrum color light are fluorescent particles made of phosphors, such as Garnet-based phosphors, Silicate-based phosphors, Orthosilicate-based phosphors, Sulfide-based phosphors, Thiogallate-based phosphors and Nitride-based phosphors. These phosphor particles are typically mixed with the transparent material used to form the encapsulants of fluorescent LEDs so that original light emitted from the semiconductor die of a fluorescent LED can be converted within the encapsulant of the fluorescent LED to produce the desired output light.

A concern with conventional fluorescent LEDs is that a significant amount of light generated from a semiconductor die is lost due to reflection at the interface between the semiconductor die and the fluorescent encapsulant, which reduces the overall LED light output. This reflection at the die/encapsulant interface is partly due to mismatch of indexes of refraction at the interface.

In view of this concern, there is a need for a device and method for emitting light with increased light extraction from a light source, such as an LED semiconductor die.

SUMMARY OF THE INVENTION

A light emitting device and method for fabricating the device utilizes a layer of photonic crystals and a region of diffusing material to enhance the light output of the device. The layer of photonic crystals is positioned over a light source, such as a light emitting diode die, and the region of diffusing material is positioned over the layer of photonic layer. The layer of photonic crystals may be embedded with a photoluminescent material to produce an output light of a particular color. The layer of photonic crystals and the region of diffusing material can be used in different types of light emitting devices, such as lead frame-mounted light emitting diodes (LEDs) and surface mount LEDs with or without reflector cups.

A light emitting device in accordance with an embodiment of the invention comprises a light source, a layer of photonic crystals positioned over the light source and a region of diffusing material positioned over the layer of photonic crystals.

A method for fabricating a light emitting device in accordance with an embodiment of the invention comprises providing a light source, forming a layer of photonic crystals over the light source, and forming a region of diffusing material over the layer of photonic crystals.

Other aspects and advantages of the present invention will become apparent from the following detailed description, taken in conjunction with the accompanying drawings, illustrated by way of example of the principles of the invention.

DETAILED DESCRIPTION

Figure 1:
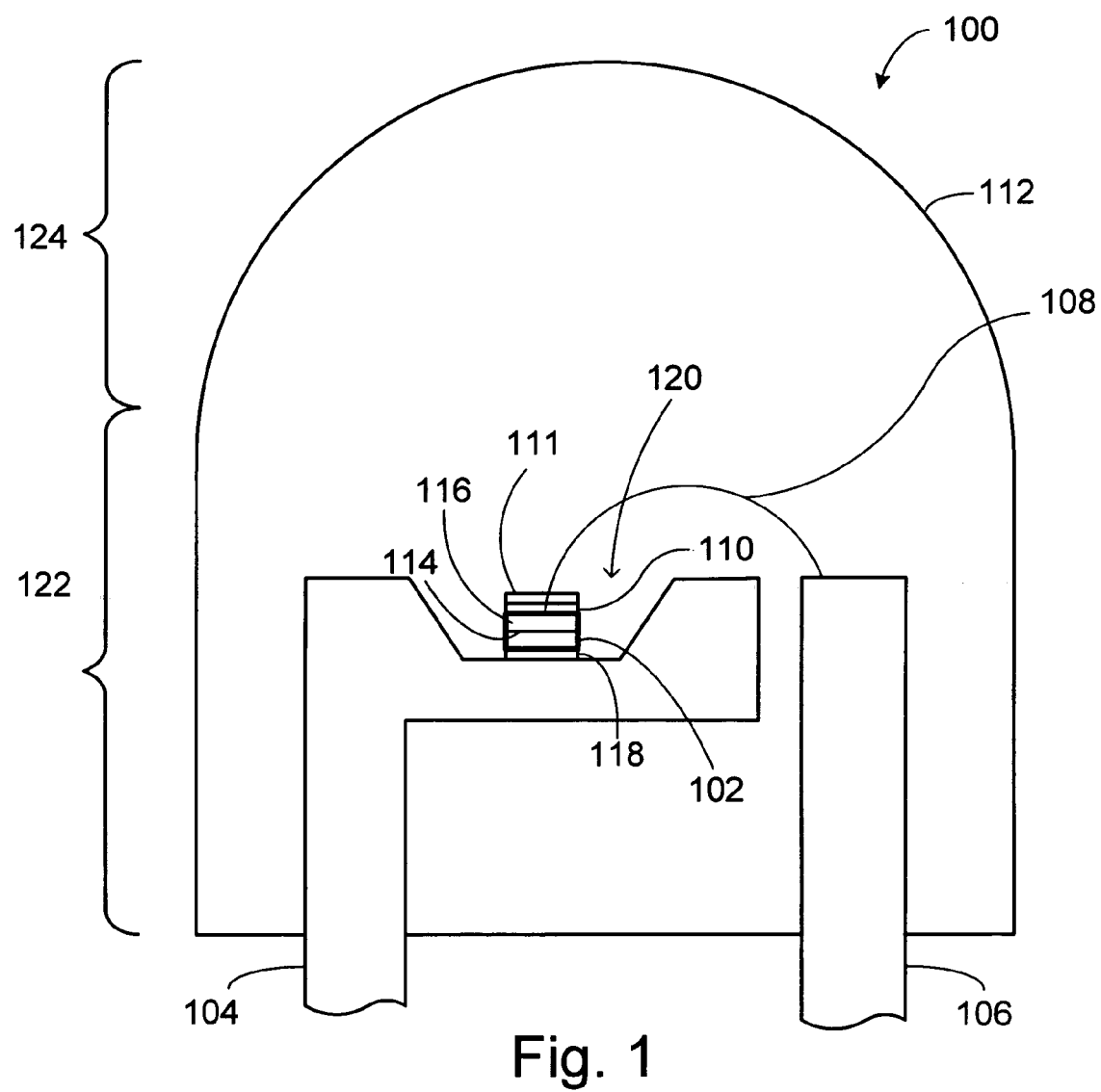
FIG. 1 is a diagram of a leadframe-mounted light emitting diode (LED) with a reflector cup in accordance with an embodiment of the invention.

With reference to FIG. 1, a leadframe-mounted light emitting diode (LED) 100 in accordance with an embodiment of the invention is described. The LED 100 includes an LED die 102, leadframes 104 and 106, a bond wire 108, a layer 110 of three-dimensional (3-D) photonic crystals, a region of diffusing material 111 and an encapsulant 112. As described in more detail below, the photonic crystal layer 110 enhances light extraction from the LED die 102, which increases the light output of the LED 100, and the region of diffusing material 111 diffuses the light extracted from the LED die, which produces an output light having a uniform color.

The LED die 102 is a semiconductor chip that generates light of a particular peak wavelength. Thus, the LED die 102 is a light source of the LED 100. Although the LED 100 is shown in FIG. 1 as having only a single LED die, the LED may include multiple LED dies. The LED die 102 may be an ultraviolet LED die or a blue LED die. As an example, the LED die 102 may be a GaN-based LED die that emits blue light. The LED die 102 includes an active region 114 and an upper layer 116. When the LED die 102 is activated, light is generated in the active region 114 of the LED die. Much of the generated light is then emitted out of the LED die 102 through the upper layer 116 of the LED die. As an example, if the LED die 102 is a GaN-based LED die, the upper layer 116 of the LED die may be a p-GaN layer. The LED die 102 is attached or mounted on the upper surface of the leadframe 104 using an adhesive material 118, and electrically connected to the other leadframe 106 via the bond wire 108. The leadframes 104 and 106 are made of metal, and thus, are electrically conductive. The leadframes 104 and 106 provide the electrical power needed to drive the LED die 102.

In this embodiment, the leadframe 104 includes a depressed region 120 at the upper surface, which forms a reflector cup in which the LED die 102 is mounted. Since the LED die 102 is mounted on the leadframe 104, the leadframe 104 can be considered to be a mounting structure for the LED die. The surface of the reflector cup 120 may be reflective so that some of the light generated by the LED die 102 is reflected away from the leadframe 104 to be emitted from the LED 100 as useful output light.

The layer 110 of 3-D photonic crystals is positioned on the LED die 102, while the region 111 of diffusing material is positioned on the photonic crystal layer. Thus, the photonic crystal layer 110 is positioned between the LED die 102 and the region 111 of diffusing material. When light is generated by the LED die 102, the photonic crystal layer 110 receives some of the light emitted from the LED die and transmits the light to the region 111 of diffusing material. The photonic crystal layer 110 is described in more detail below. The region 111 of diffusing material receives the light from the photonic crystal layer 110 and diffuses the received light. In this illustrated embodiment, the region 111 of diffusing material is a layer of diffusing material formed on the photonic crystal layer 110. The region 111 of diffusing material may be made of barium titanate, titanium oxide, aluminum oxide and/or silicon dioxide. The region 111 of diffusing material is shown in FIG. 1 to extend across the entire photonic crystal layer 110. However, in other embodiments, the region 111 of diffusing material may extend partially across the photonic crystal layer 110, covering only a portion of the photonic crystal layer.

The LED die 102, the layer 110 of photonic crystals and the region 111 of diffusing material are encapsulated in the encapsulant 112, which is also commonly known as the lamp. Thus, the region 111 of diffusing material is positioned between the encapulant 112 and the layer 110 of photonic crystals. The encapsulant 112 is a medium for the propagation of light from the LED die. The encapsulant 112 includes a main section 122 and an output section 124. In this embodiment, the output section 124 of the encapsulant 112 is dome-shaped to function as a lens. Thus, the light emitted from the LED 100 as output light is focused by the dome-shaped output section 124 of the encapsulant 112. However, in other embodiments, the output section 124 of the encapsulant 112 may be horizontally planar. The encapsulant 112 is made of an optically transparent substance so that light from the LED die 102 can travel through the encapsulant and be emitted out of the output section 124 as output light. As an example, the encapsulant 112 can be made of epoxy, silicone, a hybrid of silicone and epoxy, amorphous polyamide resin or fluorocarbon, glass and/or plastic material.

In an alternative embodiment, the diffusing material of barium titanate, titanium oxide, aluminum oxide and/or silicon dioxide can be added to the optically transparent substance of epoxy, silicone, a hybrid of silicone and epoxy, amorphous polyamide resin or fluorocarbon, glass and/or plastic material to produce the encapsulant 112. In this alternative embodiment, the resulting encapsulant 112 is also a region of diffusing material, and thus, functions as a diffusing medium.

As shown in FIG. 1, the layer 110 of 3-D photonic crystals is located on the top surface of the LED die 102. The photonic crystal layer 110 is thus positioned between LED die 102 and the region 111 of diffusing material, or between the LED die and the encapsulant 112 if the encapsulant is also a diffusing medium. In this embodiment, the photonic crystal layer 110 extends entirely across the top surface of the LED die 102, covering the entire top surface of the LED die. In other embodiments, the photonic crystal layer 110 may extend partially across the top surface of the LED die 102, covering only a portion of the top surface of the LED die. Still in other embodiments, the photonic crystal layer 110 may extend partially or entirely across one or more side surfaces of the LED die 102. As described in more detail below, the photonic crystal layer 110 operates to confine and control the light from the LED die 102 to increase light extraction from the LED die. Furthermore, the photonic crystal layer 110 serves as an index-matching medium with respect to the upper layer 116 of the LED die 102, which allows more light to be transmitted into the photonic crystal layer 110 from the LED die, and thus, further increasing the light extraction.

Figure 2:
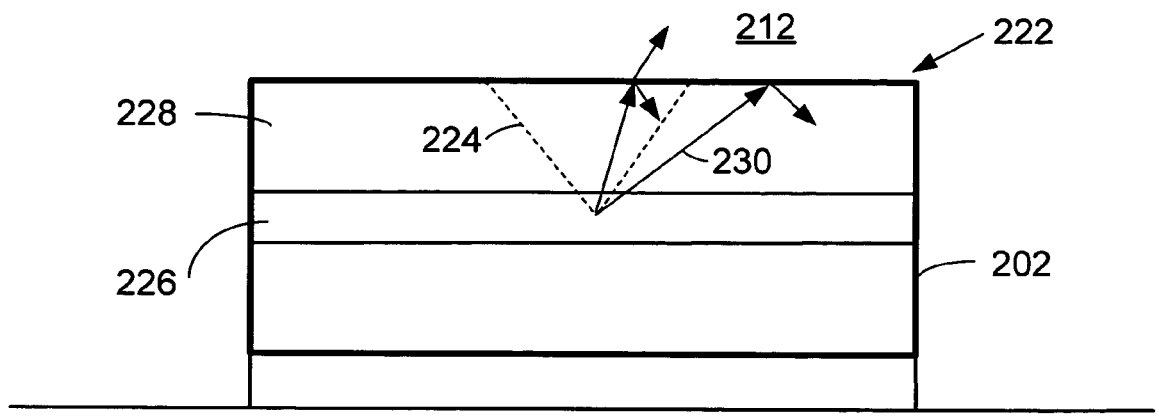
FIG. 2 illustrates light reflected at the interface between an LED die and an encapsulant of a conventional LED, which is partly due to mismatch of indexes of refraction at the interface.

In a conventional LED, as illustrated in FIG. 2, the reflectivity at an interface 222 between an LED die 202 and an encapsulant 212 is a significant factor in reducing light extraction from the LED die. The reflectivity at the die/encapsulant interface 222 is partly dependent on the critical angle of total internal reflection (TIR), which defines an escaping cone 224. This is because light generated in an active region 226 of the LED die 202 does not leave a higher refractive material, e.g., an upper layer 228 of the LED die, at incident angles greater than the critical angle of TIR, as illustrated by a path 230 in FIG. 2. Furthermore, the reflectivity goes up as the incident angles approaches the critical angle of TIR, i.e., closer to the edge of the escaping cone 224. Since light reflected at the die/encapsulant interface 222 will likely be absorbed by one or more internal layers of the LED die 202, a decrease in the reflectivity at the die/encapsulant interface will increase the light extraction from the LED die.

One technique to reduce the reflectively at the die/encapsulant interface of an LED is to place an index-matching interface layer between the LED die and the encapsulant. The index-matching interface layer reduces the reflectance within the escaping cone defined by the critical angle of TIR and increases the critical angle of TIR. This technique is utilized in the LED 100 with the layer 110 of 3-D photonic crystals, as described below.

Another technique to reduce the reflectively at the die/encapsulant interface is to roughen the interface. This increases the probability of escape for light that approaches the rough surface with angles greater than the critical angle of TIR because the particular micro-surface, and hence the escaping cone, is shifted with respect to that light. This technique may be utilized in the LED 100 by roughening the upper surface of the LED die 102.

In the LED 100, the photonic crystal layer 110 serves as the index-matching interface layer between the LED die 102 and the region 111 of diffusing material or between the LED die and the encapsulant 112 to reduce the reflectivity at the die/region of diffusing material or the die/encapsulant interface to enhance light extraction from the LED die. Thus, more light will be emitted out of the LED die 102 with the photonic crystal layer 110 than without the photonic crystal layer. Ideally, the index of refraction of the photonic crystal layer 110 should equal the index of refraction of the LED die 102. More specifically, the refractive index of the photonic crystal layer 110 should equal the refractive index of the upper layer 116 of the LED die 102 since different structural layers of the LED die typically have different refractive indexes. Alternatively, the refractive index of the photonic crystal layer 110 may be greater than the refractive index of the upper layer 116 of the LED die 102 to increase the light extraction from the LED die. Although it is preferred that the refractive index of the photonic crystal layer 110 is substantially equal to or greater than the refractive index of the upper layer 116 of the LED die 102, the refractive index of the photonic crystal layer may be higher than the refractive index of the encapsulant 112, but less than the refractive index of the upper layer of the LED die, to enhance the light extraction from the LED die.

The layer 110 of 3-D photonic crystals also serves as an optically manipulating element to emit light only in one direction, i.e., the direction toward the output section 124 of the encapsulant 112, which is perpendicular to the upper surface of the LED die 102. Three-dimensional photonic crystals are three-dimensionally periodic structures that exhibit photonic band gap properties, which can be used to manipulate light. The optical properties of the photonic crystal layer 110 allows more light from the LED die 102 to be transmitted into the encapsulant 112 toward the output section 124 of the encapsulant so that more light is emitted from the LED 100 as useful light. In an embodiment, the thickness of the photonic crystal layer 110 may be approximately 0.5-100 microns. However, in other embodiments, the photonic crystal layer 110 may have a different thickness.

Figure 3:
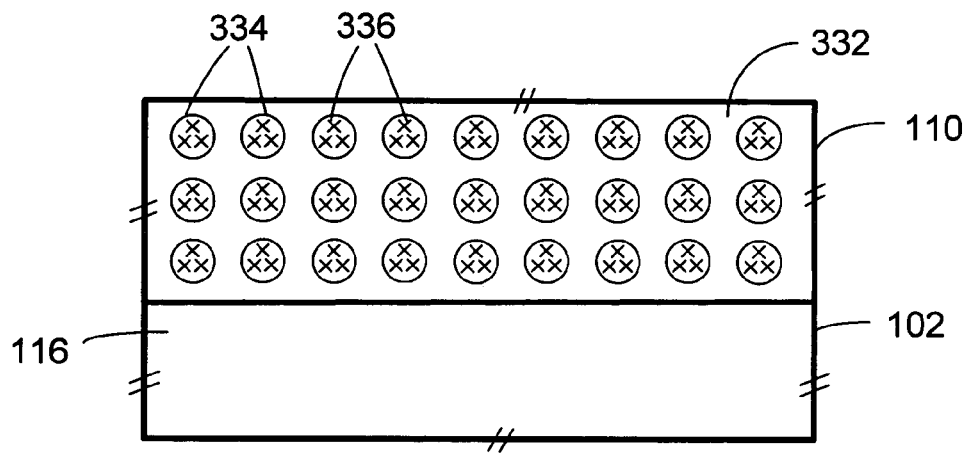
FIG. 3 is an enlarged diagram of a layer of photonic crystals included in the LED of FIG. 1 in accordance with an embodiment of the invention.

Turning now to FIG. 3, an enlarged view of the layer 110 of 3-D photonic crystals in accordance with an embodiment is shown. As illustrated in FIG. 3, the photonic crystal layer 110 includes a structural frame 332 with voids 334, which are periodically distributed throughout the layer 110. The structural frame 332 can be made of an insulator, a semiconductor or a metal. As an example, the structural frame 332 may be made of AlGaP, $TiO_2$, $Al_2O_3$ or $ZrO_2$ material. In an embodiment, the structural frame 332 is an inverted opal structure formed from monodisperse colloids. In this embodiment, the voids 334 in the structural frame 332 are spherical in shape. The diameter of the spherical voids 334 in the photonic crystal layer 110 may be in the nanometer range. However, the spherical voids 334 may be smaller or larger. In an embodiment, the voids 334 of the photonic crystal layer 110 include a photoluminescent material 336. However, in other embodiments, the photonic crystal layer 110 may not include any photoluminescent material. The photoluminescent material 336 in the photonic crystal layer 110 converts at least some of the original light generated by the LED die 102 to longer wavelength light, which may be used to produce multi-color light, such as "white" color light. Thus, the color characteristics of the output light emitted from the LED 100 may be controlled by the photoluminescent material 336 included in the photonic crystal layer 110.

The photoluminescent material 336 in the photonic crystal layer 110 may include one or more types of non-quantum phosphor particles, such as Garnet-based phosphors, Silicate-based phosphors, Orthosilicate-based phosphors, Thiogallate-based phosphors, Sulfide-based phosphors or Nitride-based phosphors. As an example, the non-quantum phosphor particles may be made of YAG, TAG, ZnSe, ZnS, ZnSeS, CaS, $SrGa_2S_4$, $BaGa_4S_7$ or $BaMg_2Al_{16}O_{27}$.

Alternatively, the photoluminescent material 336 in the photonic crystal layer 110 may include one or more types of quantum dots. Quantum dots, which are also known as semiconductor nanocrystals, are artificially fabricated devices that confine electrons and holes. Typical dimensions of quantum dots range from nanometers to few microns. Quantum dots have a photoluminescent property to absorb light and re-emit different wavelength light, similar to phosphor particles. However, the color characteristics of emitted light from quantum dots depend on the size of the quantum dots and the chemical composition of the quantum dots, rather than just chemical composition as non-quantum phosphor particles. As an example, the quantum dots may be made of CdS, CdSe, CdTe, CdPo, ZnS, ZnSe, ZnTe, ZnPo, MgS, MgSe, MgTe, PbSe, PbS, PbTe, HgS, HgSe, HgTe and $Cd(S_{1-x}Se_x)$, or made from a metal oxides group, which consists of $BaTiO_3$, $PbZrO_3$, $PbZr_zTi_{1-z}O_3$, $Ba_xSr_{1-x}TiO_3$, $SrTiO_3$, $LaMnO_3$, $CaMnO_3$, $La_{1-x}Ca_xMnO_3$.

Figure 4:
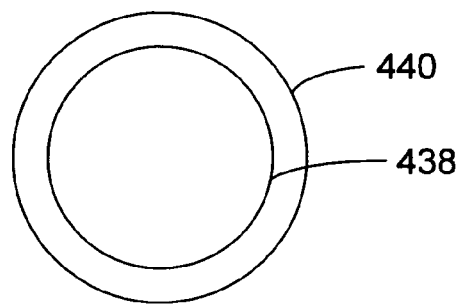
FIG. 4 is a diagram of a quantum dot covered with a coating material, which may be embedded in the layer of photonic crystals of FIG. 2, in accordance with an embodiment of the invention

In an embodiment, as illustrated in FIG. 4 the photoluminescent material 336 in the photonic crystal layer 110 includes quantum dots 438 that are covered with a coating material 440 having an index of refraction that substantially matches the index of refraction of the structural frame 332 of the photonic crystal layer 110. As an example, the coating material 440 may be titania ($TiO_2$). If the photoluminescent material 336 includes non-quantum phosphor particles, the phosphor particles may also be covered with a coating material having an index of refraction that substantially matches the index of refraction of the structural frame 332 of the photonic crystal layer 110.

Alternatively, the photoluminescent material 336 in the photonic crystal layer 110 may include one or more types of nano-phosphors. Nano-phosphors have similar optical properties as conventional phosphors mentioned above. However, nano-phosphors are smaller in size than conventional phosphors, but larger than quantum dots. The size of conventional phosphors is in the range of 1-50 microns (typically in the 1-20 micron range). The size of nano-phosphors is smaller than 1 micron, but larger than quantum dots, which may be a few nanometers in size. Similar to the quantum dots and the non-quantum phosphor particles, the nano-phosphors may also be covered with a coating material having an index of refraction that substantially matches the index of refraction of the structural frame 332 of the photonic crystal layer 110.

Alternatively, the photoluminescent material 336 in the photonic crystal layer 110 may include laser dyes, inorganic dyes or organic dyes. In an embodiment, the photoluminescent material 336 may include any combination of one or more types of non-quantum phosphor particles, one or more types of quantum dots one or more types of nano-phosphors, and one or more types of dyes (e.g., laser dyes, inorganic dyes and organic dyes).

Figure 5A:
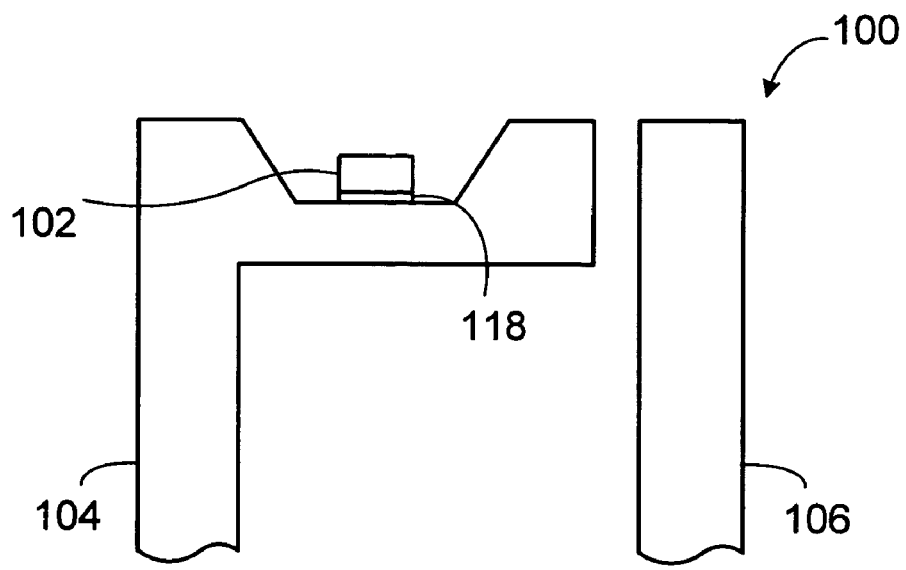
FIGS. 5A-5D illustrate the process for fabricating the LED of FIG. 1 in accordance with an embodiment of the invention.
Figure 5B:
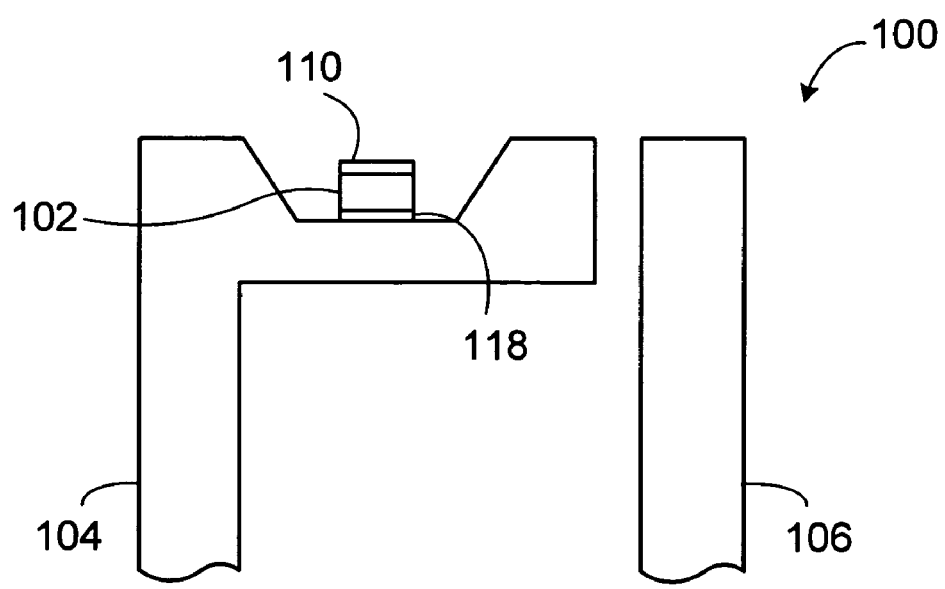

The process for fabricating the LED 100 in accordance with an embodiment of the invention is now described with reference to FIGS. 5A, 5B, 5C and 5D, as well as FIG. 1. As shown in FIG. 5A, the LED die 102 is first attached to a mounting structure, i.e., the leadframe 104, using the adhesive material 118. Next, the layer 110 of 3-D photonic crystal layer is formed on the LED die 102, as shown in FIG. 5B.

The forming of the photonic crystal layer 110 on the LED die 102 involves using monodisperse colloids as building blocks. As an example, the colloids can be silica or polymer colloidal spheres, which are currently available in a wide range of sizes and can be obtained in a narrow size distribution. The colloids are used to form synthetic opals using, for example, a self-assembly technique, such as centrifugation, controlled drying or confinement of a suspension of the monodisperse colloids. The synthetic opals are used as a template to produce the structural frame 332 of the photonic crystal layer 110 with the periodically distributed voids 334, as illustrated in FIG. 3.

Once the synthetic opals are formed, the synthetic opals are infiltrated with nano-sized crystallites or a precursor of an insulator, a semiconductor or a metal to produce the structural frame 332 of the photonic crystal layer 110. The synthetic opals are then selectively removed thermally or chemically to create the periodically distributed voids 334 in the structural frame 332. The voids 334 in the structural frame 332 may then filled with the photoluminescent material 336 to embed the photoluminescent material within the photonic crystal layer 110.

Figure 5C:
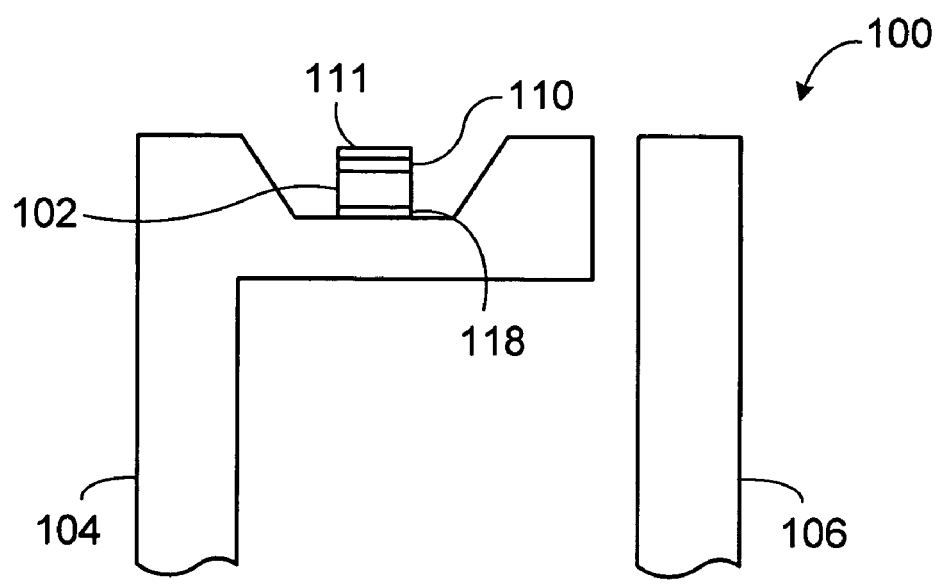

Next, the region 111 of diffusing material is formed on the photonic crystal layer 110, as shown in FIG. 5C. The region 111 of diffusing material can be formed by depositing a diffusing material of barium titanate, titanium oxide, aluminum oxide and/or silicon dioxide onto the surface of the photonic crystal layer 110. In the embodiment in which the encapsulant 112 is the region 111 of diffusing material, the diffusing material of barium titanate, titanium oxide, aluminum oxide and/or silicon dioxide is added to an optically transparent substance of epoxy, silicone, a hybrid of silicone and epoxy, amorphous polyamide resin or fluorocarbon, glass and/or plastic material. The resulting mixture is then used later to form the encapsulant 112.

Figure 5D:
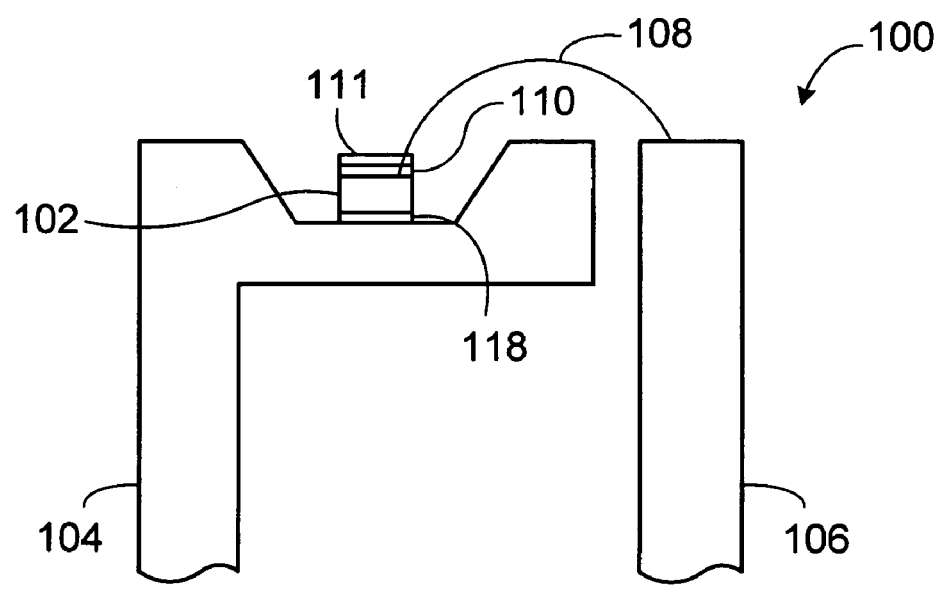

Next, the bond wire 108 is attached to the LED die 102 and the leadframe 106 to electrically connect the LED die to the leadframe 106, as shown in FIG. 5D. The encapsulant 112 is then formed over the LED die 102 to produce the finished LED 100, as shown in FIG. 1.

Figure 6:
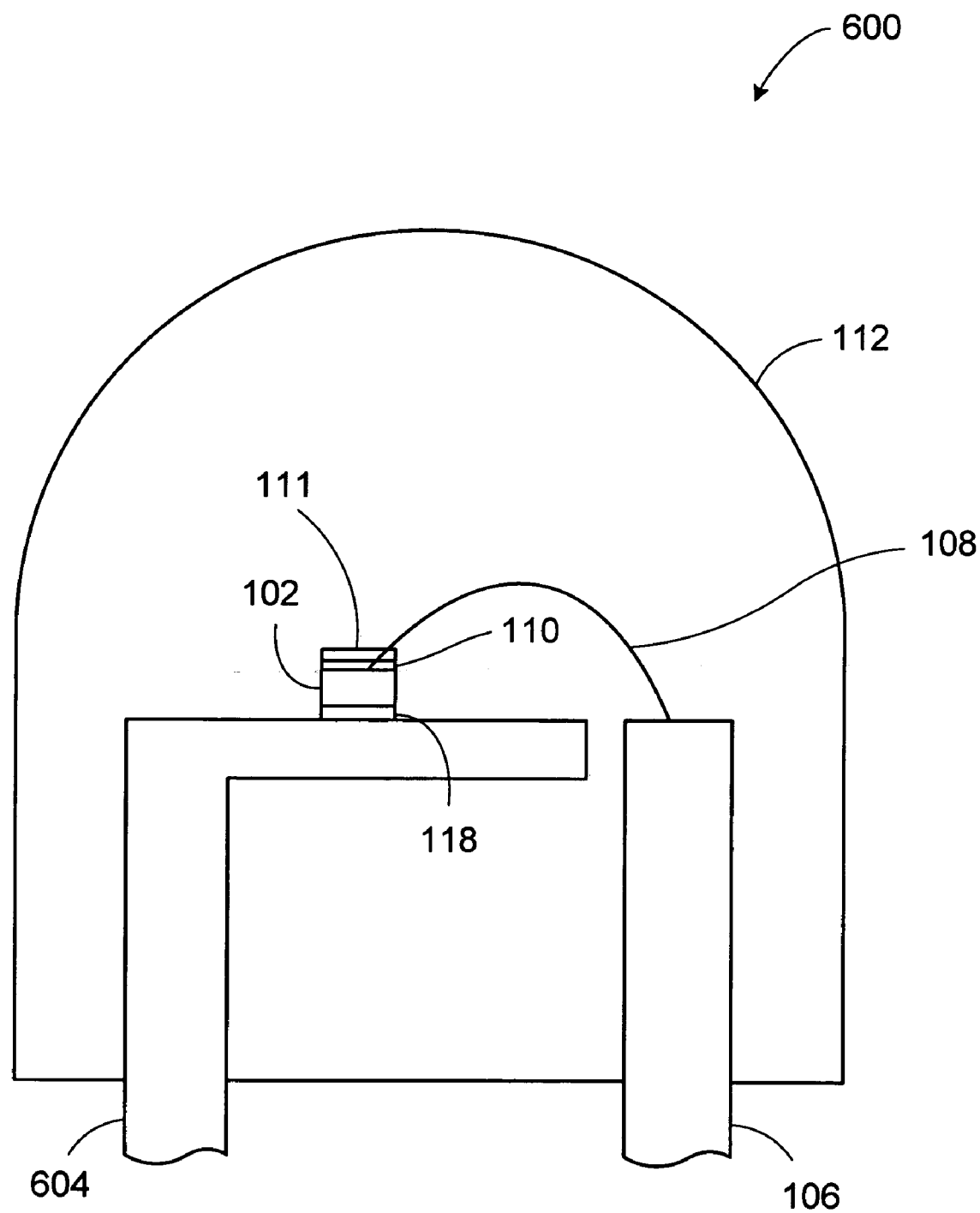
FIG. 6 is a diagram of a leadframe-mounted LED without a reflector cup in accordance with an embodiment of the invention.

Turning now to FIG. 6, a leadframe-mounted LED 600 in accordance with another embodiment of the invention is shown. The same reference numerals used in FIG. 1 are used to identify similar elements in FIG. 6. In this embodiment, the LED 600 includes a mounting structure, i.e., a leadframe 604, which does not have a reflector cup. Thus, the upper surface of the leadframe 604 on which the LED die 102 is attached is substantially planar. In the illustrated embodiment of FIG. 6, the layer 110 of 3-D photonic crystals extends across the entire top surface of the LED die. However, in other embodiments, the photonic crystal layer 110 may extend partially across the top surface of the LED die 102, covering only a portion of the top surface of the LED die. Still in other embodiments, the photonic crystal layer 110 may extend partially or entirely across one or more side surfaces of the LED die 102. Similarly, the region 111 of diffusing material is shown in FIG. 6 to extend across the entire photonic crystal layer 110. However, in other embodiments, the region 111 of diffusing material may extend partially across the photonic crystal layer 110, covering only a portion of the photonic crystal layer.

In an alternative embodiment, the encapsulant 112 of the LED 600 may also be a region of diffusing material. In this alternative embodiment, the diffusing material of barium titanate, titanium oxide, aluminum oxide and/or silicon dioxide can be added to an optically transparent substance of epoxy, silicone, a hybrid of silicone and epoxy, amorphous polyamide resin or fluorocarbon, glass and/or plastic material to produce the encapsulant 112.

Figure 7:
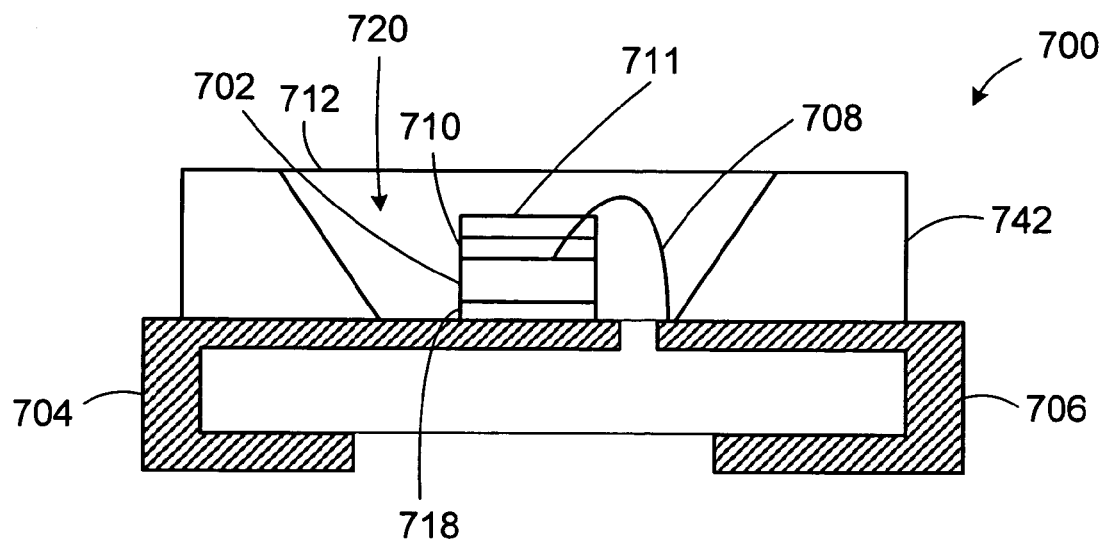
FIG. 7 is a diagram of a surface mount LED with a reflector cup in accordance with an embodiment of the invention.

Turning now to FIG. 7, a surface mount LED 700 in accordance with an embodiment of the invention is shown. The LED 700 includes an LED die 702, leadframes 704 and 706, a bond wire 708, a layer 710 of 3-D photonic crystals, a region of diffusing material 711 and an encapsulant 712. The LED die 702 is attached to the leadframe 704 using an adhesive material 718. The bond wire 708 is connected to the LED die 702 and the leadframe 706 to provide an electrical connection. The LED 700 further includes a reflector cup 720 formed on a poly(p-phenyleneacetylene) (PPA) housing or a printed circuit board 742. The encapsulant 712 is located in the reflector cup 720. In the illustrated embodiment of FIG. 7, the layer 710 of 3-D photonic crystals extends across the entire top surface of the LED die 702. However, in other embodiments, the photonic crystal layer 710 may extend partially across the top surface of the LED die 702, covering only a portion of the top surface of the LED die. Still in other embodiments, the photonic crystal layer 710 may extend partially or entirely across one or more side surfaces of the LED die 702. Similarly, the region 711 of diffusing material is shown in FIG. 7 to extend across the entire photonic crystal layer 710. However, in other embodiments, the region 711 of diffusing material may extend partially across the photonic crystal layer 710, covering only a portion of the photonic crystal layer.

In an alternative embodiment, the encapsulant 712 of the LED 700 may also be a region of diffusing material. In this alternative embodiment, the diffusing material of barium titanate, titanium oxide, aluminum oxide and/or silicon dioxide can be added to an optically transparent substance of epoxy, silicone, a hybrid of silicone and epoxy, amorphous polyamide resin or fluorocarbon, glass and/or plastic material to produce the encapsulant 712.

Figure 8:
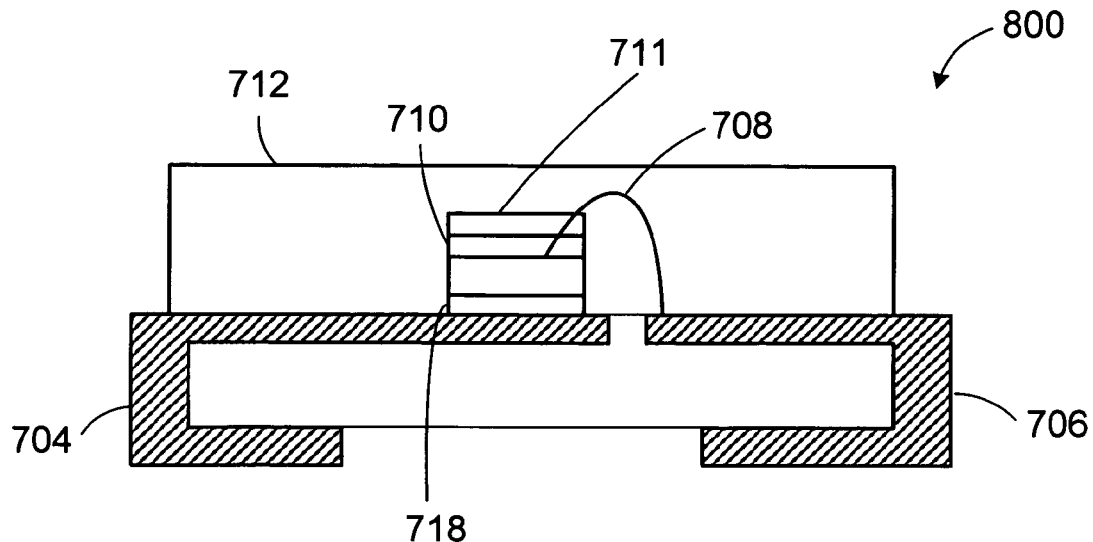
FIG. 8 is a diagram of a surface mount LED without a reflector cup in accordance with an embodiment of the invention.

Turning now to FIG. 8, a surface mount LED 800 in accordance with another embodiment of the invention is shown. The same reference numerals used in FIG. 7 are used to identify similar elements in FIG. 8. In this embodiment, the LED 800 does not include a reflector cup. In the illustrated embodiment of FIG. 8, the layer 710 of 3-D photonic crystals extends across the entire top surface of the LED die 702. However, in other embodiments, the photonic crystal layer 710 may extend partially across the top surface of the LED die 702, covering only a portion of the top surface of the LED die. Still in other embodiments, the photonic crystal layer 710 may extend partially or entirely across one or more side surfaces of the LED die 702. Similarly, the region 711 of diffusing material is shown in FIG. 8 to extend across the entire photonic crystal layer 710. However, in other embodiments, the region 711 of diffusing material may extend partially across the photonic crystal layer 710, covering only a portion of the photonic crystal layer.

In an alternative embodiment, the encapsulant 712 of the LED 800 may also be a region of diffusing material. In this alternative embodiment, the diffusing material of barium titanate, titanium oxide, aluminum oxide and/or silicon dioxide can be added to an optically transparent substance of epoxy, silicone, a hybrid of silicone and epoxy, amorphous polyamide resin or fluorocarbon, glass and/or plastic material to produce the encapsulant 712.

Although different embodiments of the invention have been described herein as being LEDs, other types of light emitting devices, such as semiconductor lasing devices, in accordance with the invention are possible. In fact, the invention can be applied to any light emitting device that uses one or more light sources.

Figure 9:
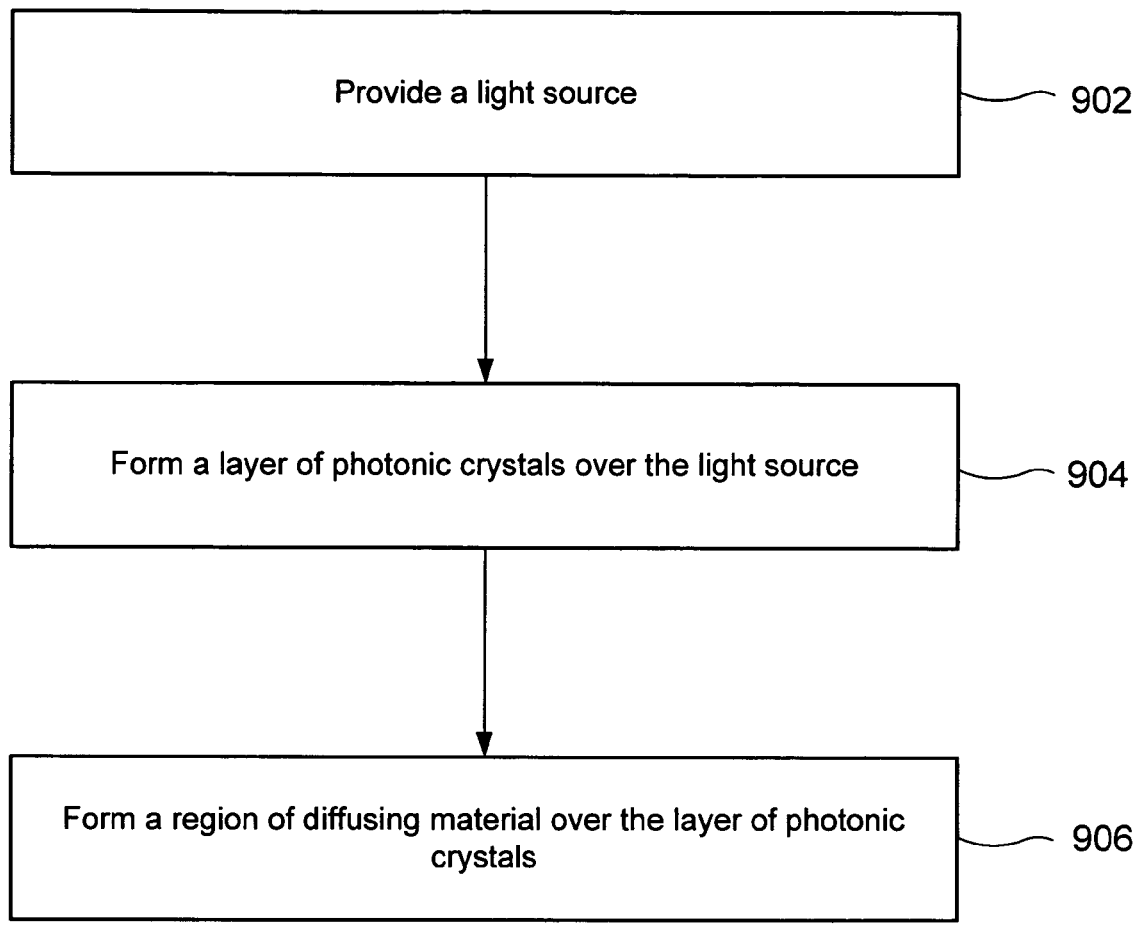
FIG. 9 is a process flow diagram of a method for fabricating a light emitting device, such as an LED, in accordance with an embodiment of the invention.

A method for fabricating a light emitting device, such as an LED, in accordance with an embodiment of the invention is described with reference to the process flow diagram of FIG. 9. At block 902, a light source is provided. As an example, the light source may be an LED die. Next, at block 904, a layer of photonic crystals is formed over the light source. In an embodiment, the layer of photonic crystals may be embedded with a photoluminescent material. The photoluminescent material may be embedded in periodically distributed voids of the photonic crystal layer, which may be created using monodisperse colloidal spheres. Next, at block 906, a region of diffusing material is formed over the layer of photonic crystals. In an embodiment, the region of diffusing material may be a thin layer of diffusing material on the photonic crystal layer. In an alternative embodiment, the region of diffusing material may be the encapsulant of the LED, which is formed over the LED die and the photonic crystal layer.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A light emitting device comprising:
    a semiconductor die that emits light;
    a layer of photonic crystals positioned on said semiconductor die; and
    a region of diffusing material positioned on said layer of photonic crystals.

2. The device of claim 1 further comprising an encapsulant that encapsulates said semiconductor die, said layer of photonic crystals and said region of diffusing material, and wherein said region of diffusing material is a layer of diffusing material over said layer of photonic crystals within said encapsulant.

3. The device of claim 1 wherein said region of diffusing material is an encapsulant that encapsulates said semiconductor die and said layer of photonic crystals.

4. The device of claim 1 wherein said region of diffusing material includes a material selected from a group consisting of barium titanate, titanium oxide, aluminum oxide and silicon dioxide.

5. The device of claim 1 further comprising a photoluminescent material embedded within said layer of photonic crystals.

6. The device of claim 5 wherein said layer of photonic crystals includes a structural frame having periodically distributed voids, said photoluminescent material being located within said periodically distributed voids.

7. The device of claim 6 wherein said structural frame of said layer of photonic crystals has an index of refraction that is substantially equal to or greater than an index of refraction of an upper layer of said semiconductor die.

8. The device of claim 1 wherein said semiconductor die is a light emitting diode die.

9. A light emitting device comprising:
    a semiconductor die that emits light;
    a layer of photonic crystals positioned on said semiconductor die; and
    a photoluminescent material embedded within said layer of photonic crystals.

10. The device of claim 9 wherein said layer of photonic crystals includes a structural frame having periodically distributed voids, said photoluminescent material being located within said periodically distributed voids.

11. The device of claim 10 wherein said periodically distributed voids are spherical in shape.

12. The device of claim 10 wherein said structural frame of said layer of photonic crystals has an index of refraction that is substantially equal to or greater than an index of refraction of an upper layer of said semiconductor die.

13. The device of claim 10 wherein said structural frame of said layer of photonic crystals is made of a material selected from a group consisting of an insulator, a semiconductor and a metal.

14. The device of claim 9 further comprising a region of diffusing material positioned on said layer of photonic crystals.

15. The device of claim 14 further comprising an encapsulant that encapsulates said semiconductor die, said layer of photonic crystals and said region of diffusing material, and wherein said region of diffusing material is a layer of diffusing material over said layer of photonic crystals within said encapsulant.

16. The device of claim 14 wherein said region of diffusing material is an encapsulant that encapsulates said semiconductor die and said layer of photonic crystals.

17. The device of claim 9 wherein said semiconductor die is a light emitting diode die.

18. A method for fabricating a light emitting device, said method comprising:
    providing a semiconductor die that emits light; and
    forming a layer of photonic crystals on said semiconductor die, including embedding a photoluminescent material within said layer of photonic crystals.

19. The method of claim 18 wherein said forming of said layer of photonic crystals includes forming a structural frame having periodically distributed voids, said photoluminescent material being embedded in said periodically distributed voids.

20. The method of claim 18 further comprising forming a layer of diffusing layer on said layer of photonic crystals.

* * * * *